United States Patent [19]

Gibbs et al.

[11] 4,045,302

[45] Aug. 30, 1977

[54] MULTILEVEL METALLIZATION PROCESS

[75] Inventors: Stephen R. Gibbs, Escondido; Kuen Chow, Del Mar, both of Calif.

[73] Assignee: Burroughs Corporation, Detroit, Mich.

[21] Appl. No.: 703,412

[22] Filed: July 8, 1976

[51] Int. Cl.² .................... C25D 5/02; H01L 23/48
[52] U.S. Cl. ........................... 204/15; 357/71
[58] Field of Search ............ 204/15, 42; 29/577, 29/590; 357/71

[56] References Cited

U.S. PATENT DOCUMENTS

| | | | |
|---|---|---|---|
| 3,741,880 | 6/1973 | Shiba et al. | 204/15 |
| 3,798,135 | 3/1974 | Bracken et al. | 204/15 |
| 3,864,217 | 2/1975 | Takahata et al. | 204/15 |
| 3,939,047 | 2/1976 | Tsunemitsu et al. | 204/15 |

*Primary Examiner*—T. M. Tufariello
*Attorney, Agent, or Firm*—G. Gregory Schivley; Mervyn L. Young; Kevin R. Peterson

[57] ABSTRACT

A method of making a multilevel conductor pattern for a semiconductor device. An aluminum layer on the substrate surface provides a situs for first level conductors. Successive soft and hard anodization steps are advantageously used to provide excellent intralevel isolation and interlevel electrical connection in desired areas. First level conductor sites are masked and the two anodized films are selectively removed in the desired nonconductive areas. The remaining first level aluminum is completely anodized. An insulating layer is then deposited and vias are formed therethrough to connect a subsequently deposited second level metallization layer with the conductor sites.

4 Claims, 10 Drawing Figures

*FIG.1A.* SOFT ANODIZATION IN CHROMIC ACID

*FIG.2A.* HARD ANODIZATION IN BORATE GLYCOL

*FIG.3A.* MASK CONDUCTOR SITE, ETCH UNPROTECTED ANODIZED FILMS, AND COMPLETE ANODIZATION.

*FIG.4A.* DEPOSIT OXIDE INSULATING LAYER AND MASK VIA

*FIG.5A.* ETCH VIA AND APPLY SECOND LEVEL METALLIZATION

MULTILEVEL METALLIZATION PROCESS

BACKGROUND OF THE INVENTION

This invention relates to a method of making semiconductor devices. More particularly, it relates to an anodization process by which multilevel metallized conductor patterns for an integrated circuit device can be formed.

Selective anodization has been gaining wide acceptance in the semiconductor industry for purposes of providing multilevel metallization patterns for integrated circuit devices. In general, an aluminum layer is selectively anodized so that the conductive aluminum remains only in the areas desired for first level conductors. An insulating layer if formed over the aluminum layer, then, an opening or via hole is formed in the insulating layer above the conductor area. A second metallization layer is then formed over the insulating layer, with the metal filling the via hole and making the electrical connection to the first level conductor. Representative examples of the anodization process as used in semiconductor processing are disclosed in U.S. Pat. No. 3,785,937 to McMahon et al and U.S. Pat. No. 3,774,079 to Zechman.

However, the known prior art methods have encountered problems with electrical shorts between adjacent conductors on the same level. For example, incompletely anodized particles remaining in the first layer of aluminum adjacent to the conductors can provide an undersirable conductive path between the various conductors on the first level of metallization. Providing a good electrical connection between the various levels of metallization without unduly increasing costs of decreasing yields has been another primary area of concern. Furthermore, the prior art methods have required a relatively large number of masking steps to provide the multilevel conductor patterns. In each masking step, the mask must be precisely aligned with the wafer. Unfortunately, the possibility of misalignment is increased with each additional masking step.

OBJECTS AND SUMMARY OF THE INVENTION

Therefore, it is the object of this invention to provide an improved method of making a multilevel conductor pattern for a semiconductor device using a minimum number of masking steps, while providing excellent electrical connection between the various metallization levels and isolation between adjacent conductors on the same level.

These and other objects of the invention are accomplished by providing a first level aluminum layer on a surface of a semiconductor substrate. A soft anodized film is provided on the aluminum surface preferably by anodization in a chromic acid solution. A hard anodization step directly following the soft anodization provides a nonporous alumina film subjacent to the porous soft anodized film. The desired conductor sites are then masked and the unprotected anodized films are removed from the first level aluminum layer. The aluminum layer is then completely anodized to anodize the aluminum layer except where the desired conductor site areas have been protected by the maskant. The preliminary soft anodization step promotes complete anodization of the unprotected aluminum layer to prevent residual aluminum particles from remaining therein which may electrically short together adjacent conductors on the first level. An insulating layer is then deposited on the substrate. A chemically vapor deposited glass layer is preferably advantageously used as the insulating layer. A second masking step covers the insulating layer except in the areas where second level metallization is desired to be connected to the first level conductors. Openings or via holes are etched through the insulating layer and the two anodized aluminum films on top of the first level conductor. The first soft anodization step inhibits the formation of a hardened, difficult to remove phase of alumina on the top of the conductor site during the deposition of the insulating layer. Consequently, all of the nonconductive materials on the first level conductors are readily removed during the via hole etching process. The maskant is removed and the second level of metallization is then formed on the substrate to make electrical connection with the first level conductor through the via hole.

BRIEF DESCRIPTION OF THE DRAWINGS

FIGS. 1A–5A show block diagram summarizations of the steps illustrated in FIGS. 1–5, respectively.

DESCRIPTION OF THE PREFERRED EMBODIMENT

Figure 1:
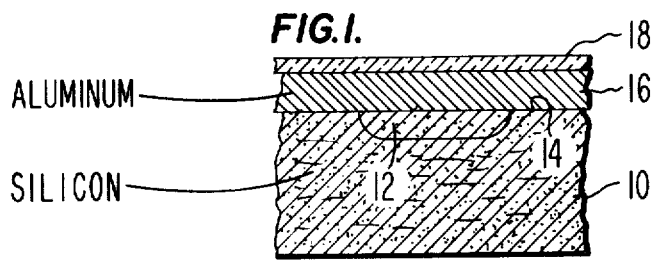
FIGS. 1–5 show a partial cross sectional view of a semiconductor device during successive steps of the method of this invention.

Referring to FIG. 1, there is shown a silicon semiconductor substrate 10 having an active or passive device 12 in the upper surface 14. It should be understood that the drawings illustrate only a portion of a semiconductor substrate and that this invention is particularly useful for providing multilevel conductors to an integrated circuit device in which there are a plurality of devices therein. However, in an attempt to clearly focus on the inventive features of this invention, it will be illustrated with respect to making the electrical connection to only the device 12 shown in the drawing.

A first level aluminum layer 16 is formed on the surface 14 of substrate 10. It should be noted that it is contemplated that in manufacturing an integrated circuit chip the first level metallization layer would be deposited over an insulating layer (e.g. silicon dioxide) having openings above the devices to be contacted thereby insulating it from other areas on the substrate to which contact is not desired. Preferably, the layer 16 is formed by known metal vacuum evaporation processing techniques. The thickness of aluminum layer 16 should be sufficient to provide the desired current carrying capacity for the device 12 and in this example this is about 10,000 A thick.

Aluminum layer 16 is then subjected to a soft anodization step to form a porous alumina (aluminum oxide) film 18 on its surface with a thickness of 100 to 1,000 A. The method and apparatus used for anodizing semiconductor wafers are well known in the art and need not be described in detail. Briefly, the wafer is submersed in an electrolytic anodizing solution and a potential is supplied between the substrate 10 and the solution. A positive potential is applied to the substrate and a negative potential is applied to the electrolytic solution. The exposed aluminum surface is then converted to an alumina film of varying thicknesses depending upon various parameters such as the length of time, and potential levels.

It is a feature of this invention that the first anodization step is a soft anodization. By soft anodization we mean that the aluminum layer is provided with a porous alumina film, as compared with a nonporous or barrier layer type of alumina film which is provided by hard anodization. This preliminary soft anodization has provided superior results and facilitates the use of relatively simple forward subsequent processing techniques. For example, it provides a surface to which photoresist will easily adhere. Moreover, it keeps the surface of the aluminum layer 16 smooth thereby suppressing undesirable hillock formation which deleteriously effects subsequent interlevel metallization connection. In the preferred embodiment, the solution is a 5–15% by volume chromic acid solution mixed with de-ionized water. The potential applied between the substrate and solution in this embodiment is 5 to 15 volts. The wafer remains immersed in the solution for a time period of about 5–10 minutes. A shorter time period would not provide the desired thickness for the porous aluminum layer 18, whereas a longer time period would consume too much aluminum. While the various parameters can be changed, a 10% chromic acid solution at 10 volts and 5 milliamperes/cm$^2$ for 10 minutes has provided extremely satisfactory results.

Figure 2:
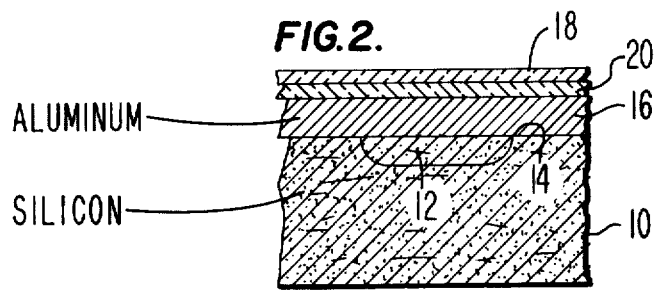

Referring now to FIG. 2, the wafer is removed from the solution and rinsed with de-ionized water and then dried. The wafer is then subjected to a second anodization step. The second anodization step is a hard anodization to form a nonporous or barrier alumina layer 20 subjacent to the porous alumina layer 18. By hard anodization we mean an anodization which forms a nonporous or barrier alumina layer, as compared with a soft anodization which forms a porous layer. The solution for the hard anodization step is preferably borate glycol which can be formed by mixing 900 gms ammonium pentaborate with 3000 gms. of ethylene glycol. The wafer is anodized in the borate glycol solution at a potential of 60–120 volts to form barrier layer 20. The thickness of layer 20 depends upon the voltage applied, with the thickness being about 10–14 A/volt. Anodization at 100 volts until the current becomes negligible (usually taking no longer than 5 minutes) has provided excellent results.

Figure 3:
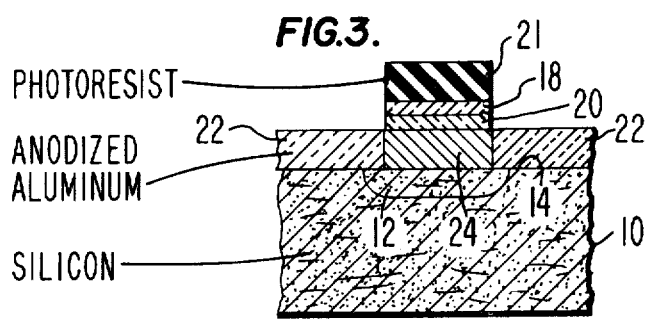

Referring now to FIG. 3, the desired conductor sites are masked with a photoresist 21 using known photolithographic techniques. For example, the photoresist is spun onto the wafer, baked for about 5 minutes and selectively exposed through a mask with ultraviolet light. The resist 21 is developed and removed in the areas where first level conductors are not desired to be formed. The wafer is then submerged into an etchant which removes the unprotected alumina flims 18 and 20. A preferred etchat which does not significantly attack the underlying aluminum is a solution of ammonia fluoride (NF$_4$F), acetic acid, and water. Phosphochromic acid may also be used.

With the photoresist 21 remaining in place, the wafer is then anodized to completely convert the unprotected portions of the aluminum layer 16 to porous nonconductive alumina. For ease of description, the anodized aluminum portion of layer 16 will now be designated by the numeral 22 whereas the unanodized aluminum portion which now forms the first level conductor will be designated by the numeral 24. A preferred anodizing solution is a 0.5–5% phosphoric acid (H$_3$PO$_4$) solution. Other solutions can be used such as sulfuric, chromic, and oxalyic acids. The final anodization is conducted at a 20 to 50 volt potential for a time period of 30 to 90 minutes depending upon the thickness of the aluminum.

Again the parameters can be varied as long as the unprotected aluminum portions 22 are completely anodized.

We have discovered that the preliminary soft anodization step which forms porous alumina layer 18 promotes complete anodization of portions 22 to prevent any residual aluminum particles from remaining therein which may cause shorting between adjacent first level conductors. It is believed that the soft anodization inhibits the formation of single crystalline alumina in the barrier layer 20 which may retard the conversion of the underlying aluminum 16 to porous, nonconductive aluminum oxide. Otherwise, the unconverted aluminum in the first level metallization may result in electrical shorts between adjacent conductors in the first level.

Figure 4:
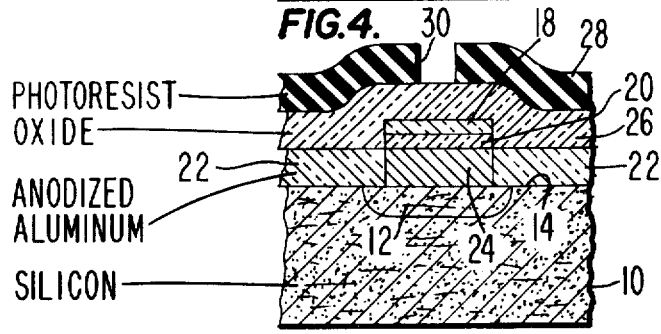
Figure 5:
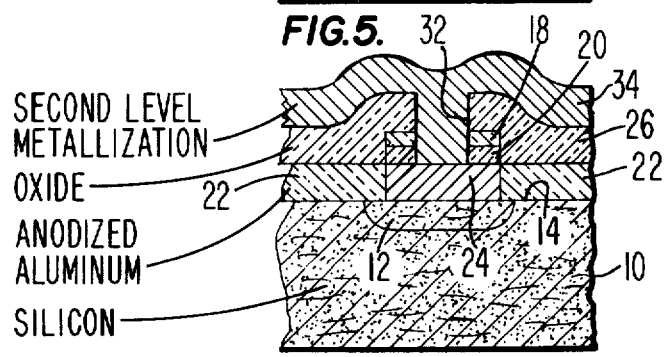

Turning now to FIG. 4, an insulating layer 26 is deposited on the surface of the substrate after the photoresist 21 is removed. Insulating layer 26 covers the entire upper surface of the substrate contiguous anodized alumina portions 18 and 20 as shown in FIG. 4. We have discovered that excellent results are obtained when the insulating layer is a phosphosilicate glass (P$_2$O$_5$-SiO$_2$). It is deposited to a thickness of 2,000–10,000 A using well known techniques. It is preferred because of its thermal expansion characteristics and its gettering ability to trap unwanted mobile ions, such as sodium. Other insulating layers can be used such as aluminum oxide or silicon nitride, however, the phosphosilcate glass is preferred because of the reasons set forth above. However, when such a glass is used, high temperatures are required in excess of 350° C to deposit it. At such high temperatures, the alumina barrier layer 20 has a tendency to convert to a hard, difficult to remove crystallographic phase often referred to as "Gamma prime" as noted before. It should be noted that this phase may have also begun to form when the photoresist 21 was baked. However, in the same manner that the soft anodized layer 18 insured that the aluminum layer 16 would be completely converted, it also insures the barrier layer 20 can be readily etched away to form nonobstructed via holes. Therefore, when the via holes are etched in a subsequent process, all of the nonconductive particles are removed from the top of the conductor 24. This will become clear later in the description of this invention.

After insulating layer 26 has been deposited, a photoresist layer 28 is formed on the top of the substrate 10 covering the insulating layer 26. An opening 30 is formed by photolithographic techniques in the same manner as described with photoresist layer 21 of FIG. 3. Opening 30 is located directly above the conductor 24 to which second level metallization is desired to be connected. We have discovered that it is preferable that the size of opening 30 be slightly smaller than the underlying conductor 24 in order to prevent undesirable etching of the field aluminum oxide 22 during via formation. Using the photoresist layer 28 as a mask, a via hole 32 is etched through the insulating layer 26, and then through the alumina layers 18, 20. A solution of ammonium flouride, acetic acid, and water can be used to etch the insulating layer 26 down to alumina layers 18, 20. The photoresist is removed, and the alumina layers 18, 20 are etched away with a heated phosphochromic acid solution using the insulating layer as a mask. It is important to note that the inslating layer 26 "mask" is already self-aligned and consequently there is no misalignment possibility.

After via hole 32 has been etched, the second level metallization 34 is deposited on the surface of the wafer.

For example, a 12,000 A thick aluminum layer can be formed by known hot substrate evaporation techniques to reduce via resistance and enhance adhesion as well as promote good step coverage. The metallization layer 34 extends through via hole 32 and makes the electrical connection with the first level conductor 24. It can now be realized that it is important that all of the nonconductive areas be removed from the upper surface of first level conductor 24. If not, the nonconductive areas will impede the electrical connection between the second level metallization 34 and the first level conductor 24. As noted before, the porous anodized alumina film 18 prevents the conversion of the underlying barrier layer alumina 20 to the hardened gamma prime phase; consequently, all of the nonconductive material is readily removed using commonly known etchants to form a clean, unobstructed via hole 32.

It is another feature of this invention that only two mask alignment steps are required during processing. The first mask alignment is during the step shown in FIG. 3 in which the photoresist 21 is selectively applied to cover the desired conductor sites. The second and final mask alignment is to form openings 30 in photoresist layer 28 of FIG. 4. The opening 30 defines the via holes 32 for making the desired electrical connections to the first level conductor 24. Consequently, the method of this invention provides a means by which the possibility of misalignment is minimized.

The barrier layer 20 of alumina formed by the hard anodization step prevents undesirable hillock formation in the first level of metallization. If it was not for the barrier layer 20, the first level aluminum may form projections or "hillocks" during subsequent heat treatment which can protrude through the insulating oxide layer 26 and short to the second level metallization 34.

Another feature of our invention is that there is a "double" mask during the anodization of the first level metallization 16. As can be seen in FIG. 3, not only does the barrier alumina layer 20 provide protection, but the photoresist 21 also adds additional protection. Any pin holes which may be present in the barrier layer 20 are covered by the photoresist 21. Consequently, none of the underlying aluminum is unintentionally anodized when forming conductor 24. Moreover, the double mask promotes superior definition along the edges of the conductor 24.

Therefore, while this invention has been described in connection with a specific example thereof in full compliance with the patent laws, we do not intend to limit the scope of our invention except has defined by the following claims.

We claim:

1. A method of making a multilevel conductor pattern for a semiconductor device comprising:
    depositing a first level aluminum layer on a semiconductor substrate;
    anodizing said first level aluminum to form a porous alumina layer on the top surface thereof;
    anodizing said first level aluminum layer to form a barrier alumina layer subjacent to the porous alumina layer;
    masking desired first level conductor sites with a resist;
    etching both of the alumina layers down to the first level aluminum layer except in the conductor site areas protected by the resist;
    anodizing the first level aluminum layer to convert it to nonconductive alumina except in the conductor site areas protected by the resist and the remaining barrier alumina layer;
    removing the resist;
    forming an insulating layer over the first level aluminum layer;
    etching an opening through the insulating area, porous alumina layer, and barrier alumina layer, respectively, to expose a portion of the first level aluminum which has not been anodized and is still conductive; and
    depositing a second level aluminum layer on the insulating layer, with the second level aluminum contacting the unanodized portion of the first level aluminum through the opening.

2. The method of claim 1 wherein the porous alumina layer is anodized in a chromic acid solution.

3. The method of claim 1 wherein the barrier alumina layer is anodized in a borate glycol solution.

4. The method of claim 1 wherein the insulating layer is a phosphosilcate glass which is deposited at a temperature in excess of 350° C.

* * * * *